United States Patent [19]
Kang et al.

[11] Patent Number: 5,552,735
[45] Date of Patent: Sep. 3, 1996

[54] MULTI-GIGAHERTZ SINGLE FLUX QUANTUM SWITCH

[75] Inventors: Joonhee Kang, Seoul, Rep. of Korea; John X. Przybysz, Penn Hills; Anthony H. Worsham, Pittsburgh, both of Pa.

[73] Assignee: Northrop Grumman Corporation, Los Angeles, Calif.

[21] Appl. No.: 319,707

[22] Filed: Oct. 7, 1994

[51] Int. Cl.$^6$ ............................. H03K 19/195; H03K 3/38
[52] U.S. Cl. ............................. 327/367; 327/528; 327/415
[58] Field of Search ......................... 327/186, 366–368, 327/370, 372, 373, 527, 528, 415

[56] References Cited

U.S. PATENT DOCUMENTS

| | | | |
|---|---|---|---|
| 4,107,554 | 8/1978 | Yao | 327/367 |
| 4,117,354 | 9/1978 | Geewala | 327/367 |
| 4,342,924 | 8/1982 | Howard et al. | 327/367 |
| 4,555,643 | 11/1985 | Kotera et al. | 307/476 |
| 4,603,263 | 7/1986 | Tahara et al. | 327/186 |
| 4,785,426 | 11/1988 | Harada et al. | 327/528 |
| 5,260,264 | 11/1993 | Kurosawa et al. | 505/1 |
| 5,436,886 | 7/1995 | McGill | 370/16 |
| 5,440,546 | 8/1995 | Bianchini, Jr. | 370/60 |

FOREIGN PATENT DOCUMENTS 401184881  7/1989  Japan ................. 327/366

*Primary Examiner*—Timothy P. Callahan
*Assistant Examiner*—T. Lam

[57] ABSTRACT

A switch for controlling the throughput of a signal between a pair of input channels and a pair of output channels is provided which receives an input signal from each of the pair of input channels. The switch transmits an output signal to each of the pair of output channels. Four line channels are provided within the switch. Each of the four line channels connects one of the pair of input channels and one of the pair of output channels. Four line channel switches are also provided, one line channel switch provided on each of the line channels. Each of the four line channel switches is controlled by a signal to open or close the four line channels.

8 Claims, 5 Drawing Sheets

MULTI-GIGAHERTZ SINGLE FLUX QUANTUM SWITCH

BACKGROUND OF THE INVENTION

1. Field of the Invention

This invention relates to the field of high speed communication, and, more particularly, to the field of superconductive digital switches for use in multi-gigahertz applications.

2. Description of the Prior Art

Technological need for high speed communications is rapidly growing in the current global communication environment. Future data highway networks and videophone systems can be realized by developing multi-gigahertz data communication technology. Fiber optic technology offers gigahertz speed data transmission to make a future multi-gigahertz data communication feasible. The synchronous optical network (SONET) and the asynchronous transfer mode (ATM) packet switching technology are considered to be future technologies to accomplish multi-gigahertz data communication. These are major components of a future global network.

The biggest obstacle to full utilization of the large bandwidth available with optical fiber technology is in the switching network nodes. Presently the most advanced switching networks use 16 channel input×16 channel output ATM switches operating at 100 Mbps. Developing a switch operable at tens of gigahertz speed is critical to advancing the current technology to a multi-gigahertz technology. Consequently, there is a need for an improved digital switch capable of operating at multi-gigahertz speeds.

SUMMARY OF THE INVENTION

Superconductivity can provide a solution to the problem of multi-gigahertz digital switching by using single flux quantum (SFQ) Josephson circuits. An SFQ Josephson circuit can be operated at orders of magnitude higher speeds than that of the competing semiconductor technologies. Also, the power required to operate SFQ circuits is orders of magnitude lower than that required for other technologies.

SFQ circuits utilize non-hysteretic Josephson junctions which can be switched from a "0" state to a "1" state which self-resets to the "0" state. The existence and non-existence of a voltage pulse represents the state and "0" state, respectively. The pulse width is $\tau_o = \Phi_o/(I_c R_n)$, where $\Phi_o$ is 2.07 mV·psec, $I_c$ is Josephson critical current and $R_n$ is the normal state resistance of the Josephson junction. Typical values of $I_c R_n$ are a few tenths of a mV to a few mV, resulting in the values of $\tau_o$ only a few picoseconds or less. An SFQ counter and an SFQ shift register were demonstrated to operate properly at speeds above 100 Gbps with power consumption of only tens of μW.

The preferred switch implementation includes a pair of input channels and a pair of output channels. The switch receives an input signal from each of the pair of input channels and transmits an output signal to each of the pair of output channels. Four line channels provided within the switch connect each input channel and each output channel. A line channel switch is provided in each line channel. Each line channel switch is operable by a control signal to open or close each of the four line channels. Josephson junctions are used in the line channel switches to control the closing of the line channel switch.

DETAILED DESCRIPTION OF THE PREFERRED EMBODIMENTS

Figure 1A:
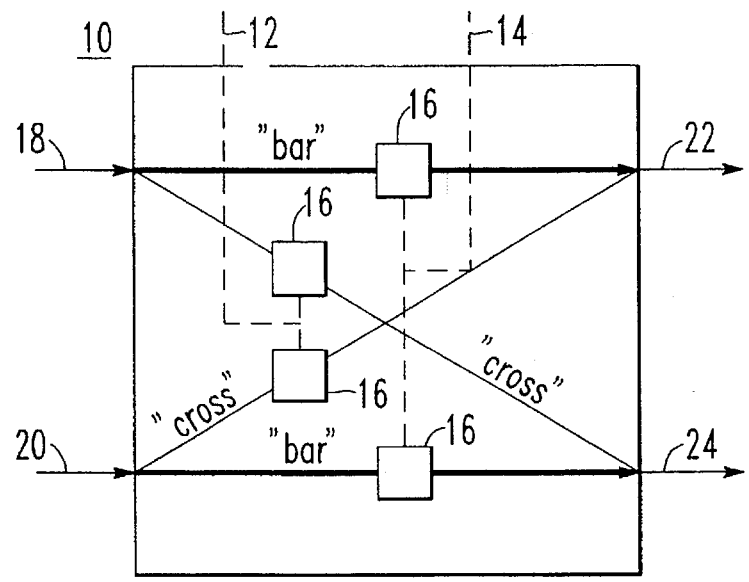
FIG. 1a is a schematic drawing showing the basic operation of a presently preferred embodiment of the switch of the present invention showing the "bar" action.
Figure 1B:
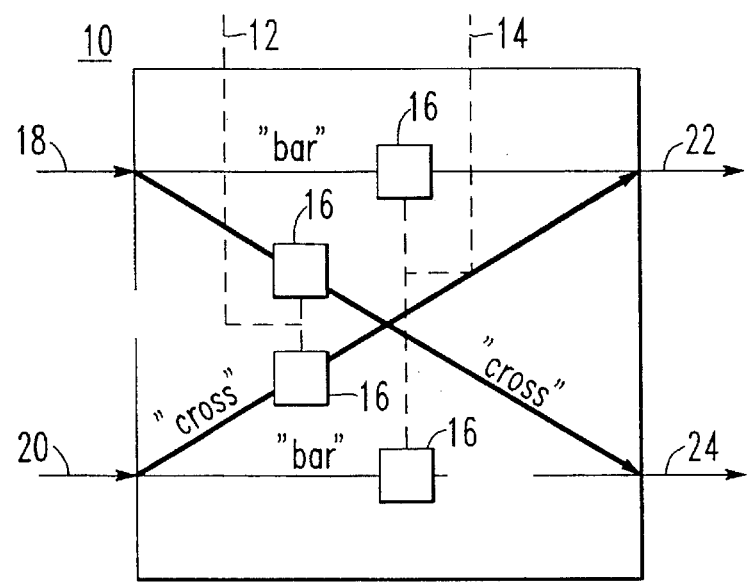
FIG. 1b is a schematic drawing showing the basic operation of a presently preferred embodiment of the switch of the present invention showing the "cross" action.

A superconducting SFQ switch is presented which operates at multi-gigahertz speeds. FIG. 1a and 1b are schematic diagrams illustrating the basic principle of the switch operation used to build an SFQ switch. The switch 10 is controlled by two control signals 12 and 14 which open and close the line switches 16 for a "bar" action as shown in FIG. 1a and a "cross" action as shown in FIG. 1b. When the control signals 12 and 14 are applied for the "bar" action as shown in FIG. 1a, signals arriving at input channels 18 and 20 are sent to output channels 22 and 24, respectively. For the "cross" action, as shown in FIG. 1b, signals arriving at input channels 18 and 20 are sent crossed to output channels 24 and 22, respectively.

Figure 2:
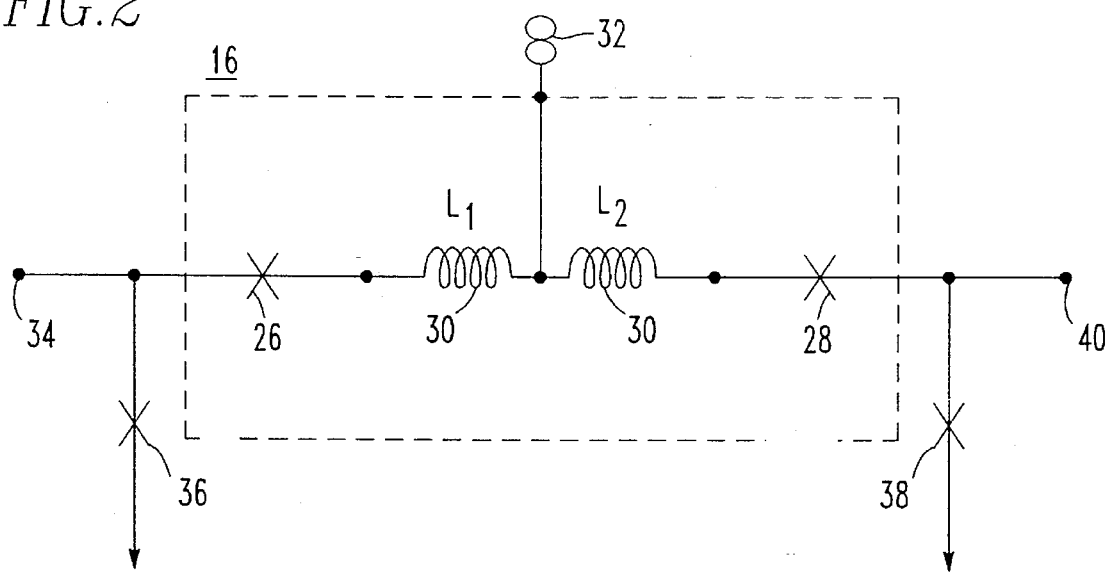
FIG. 2 is a circuit diagram of a presently preferred embodiment of the line switch used in the present invention.

FIG. 2 shows a line switch 16 composed of two non-hysteretic Josephson junctions 26 and 28 and two inductors 30. The bias current $I_{bias}$ 32 blocks the passage of SFQ voltage pulses through the line switch 16. The operation of the switch 16 is as follows.

The input signal is introduced into the input channel 34 in the form of the stream of SFQ voltage pulses. For each voltage pulse, the input junction $JJ_{input}$ 36 experiences a momentary voltage state corresponding to a single magnetic flux quantum and transfers the voltage pulse to the line switch 16. With $I_{bias}=0$, the line switch 16 is closed and an input SFQ voltage pulse passes through the superconducting inductors 30, and the unbiased Josephson junctions, $JJ_{buffer}$ 26 and $JJ_{block}$ 28, reaching to the output junction $JJ_{output}$ 38. $JJ_{output}$ 38 experiences a momentary voltage state and outputs an SFQ voltage pulse to output channel 40. In such a manner, the line switch 16 is "closed".

However, by raising $I_{bias}$ 32 to the level of about 1.4 times the $I_c$ of $JJ_{block}$ 28, $JJ_{block}$ 28 becomes current biased and blocks the SFQ voltage pulses trying to pass through the circuit. An SFQ pulse introduced to the circuit puts a magnetic flux quantum into the closed loop consisting of two inductors and four junctions. This causes an additional current flow through $JJ_{block}$ 28 and causes this junction to switch to a momentary voltage state and drives the magnetic flux out of the loop. Since this action happens only on $JJ_{block}$ 28, $JJ_{output}$ 38 does not experience a momentary voltage state. There is no output SFQ voltage pulse. In such a manner, the line switch 16 is "opened".

Figure 3:
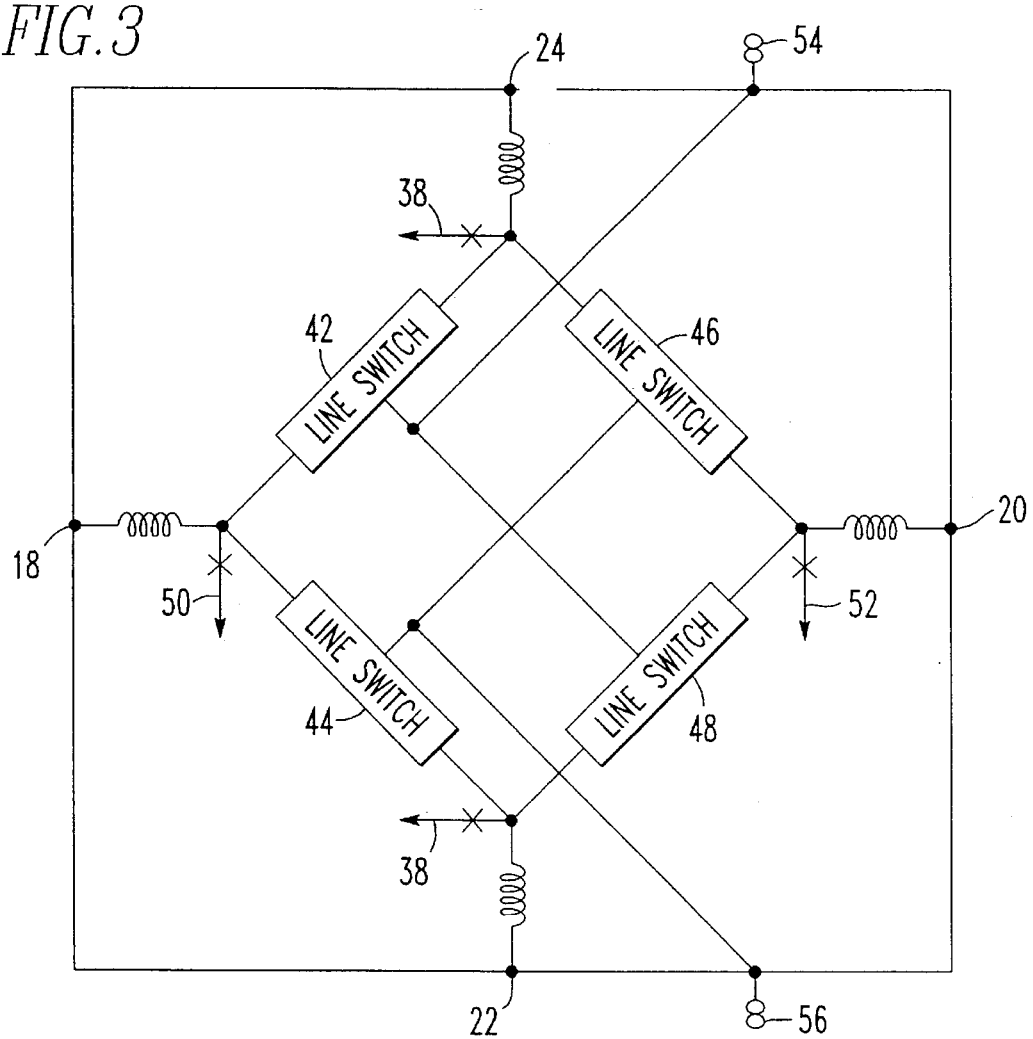
FIG. 3 is a circuit diagram of the switch of FIG. 1.

When there is a second input channel connected to this output channel by a second line switch, as shown in FIG. 3, an SFQ voltage pulse can be transferred to this output channel even when the first line switch 16 is open and causes $JJ_{output}$ 38 to experience a momentary voltage state. However, this output SFQ voltage pulse caused by a second input channel is prevented from flowing back to the first input channel by $JJ_{buffer}$ 26. By the same operating principles as $JJ_{block}$ 28, $JJ_{buffer}$ 26 prevents the voltage pulse flowing from the input channel 34 to the output channel 40.

The complete circuit diagram of the SFQ switch 10 is shown in FIG. 3 where four line switches 42, 44, 46, and 48, similar to line switch 16 from FIG. 2, are used. When the input signal in the form of an SFQ pulse is fed into input channel 18, it drives $JJ_{input}$ 50 into the voltage state momentarily, creating an SFQ voltage pulse which propagates to both of two line switches 42 and 44, one for the "bar" action and the other for the "cross" action. Similarly, the input signal fed into input channel 20 drives $JJ_{input}$ 52 into the voltage state creating an SFQ voltage pulse which propagates to both of two line switches 46 and 48.

The switch 10 is controlled by two control lines, BAR 54 and CROSS 56. When BAR control line 54 is biased and CROSS control line 56 is unbiased, the two line switches 44 and 46 for the "bar" action are closed and those line switches 42 and 48 for the "cross" action open. The input signals on channels 18 and 20 get through to output channels 22 and 24, respectively. On the other hand, if BAR control line 54 is unbiased and CROSS control line 56 is biased, these two input signals cross to output channels 24 and 22, respectively.

Figure 4:
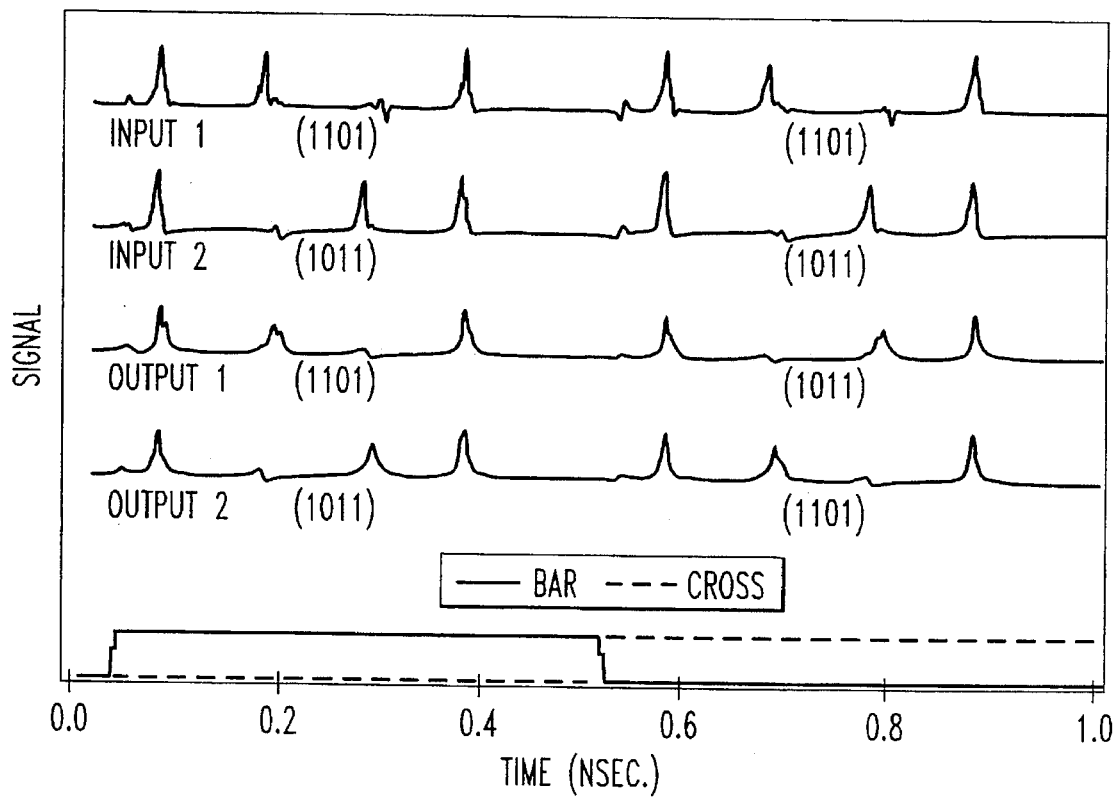
FIG. 4 is a chart presenting the results of a simulation test performed on a switch modeled upon the switch of FIG. 3.

A JSIM simulation program has been used to test this SFQ switch. FIG. 4 shows the simulation result of the circuit operating at 10 Gbps. The circuit component values used in this simulation for $JJ_{input}=JJ_{output}=333$ µA, $JJ_{buffer}=JJ_{block}=250$ µA, $L_1=L_2=4$ pH, and $I_{bias}=400$ µA. Digital signals "11010" and "10110" have been used for signal 1 and signal 2, respectively, to track the paths though which the signals followed. Signal 1 was fed into input channel 1 and signal 2 was fed into input channel 2. FIG. 4 clearly shows that the signals 1 and 2 move through the SFQ switch to output channels 1 and 2, respectively, when the BAR control signal is on, and move through to output channels 2 and 1, respectively, when the CROSS control signal is on. The power consumption of this switch is only a few µW.

A N channel×N channel switching network can be constructed by using this SFQ switch. The total number of the SFQ switches required for this scales is $\approx(N/2)(\log_2 N)^2$. To build a 64 channel×64 channel switching network, about 1000 SFQ switches are required. The network will operate at the speed of above 10 GHz with a power consumption of only a few mW. A 1000 channels×1000 channels switching network requires about 50,000 SFQ switches and uses about 100 mW of power.

An SFQ switch has been constructed with non-hysteretic Josephson junctions. Successful operation of the switching operation at the speed of above 10 Gbps was demonstrated through JSIM simulation. This is two orders of magnitude higher than the highest speed available in current technology. The power required to operate this switch is only a few µW. Only about 100 mW of power will be consumed by a 10 Gbps 1000 channels×1000 channels switching network constructed with this SFQ switch. Since the SFQ switch described in this disclosure was constructed with only non-hysteretic junctions, it is compatible with currently available high $T_c$ Josephson junctions.

Figure 5:
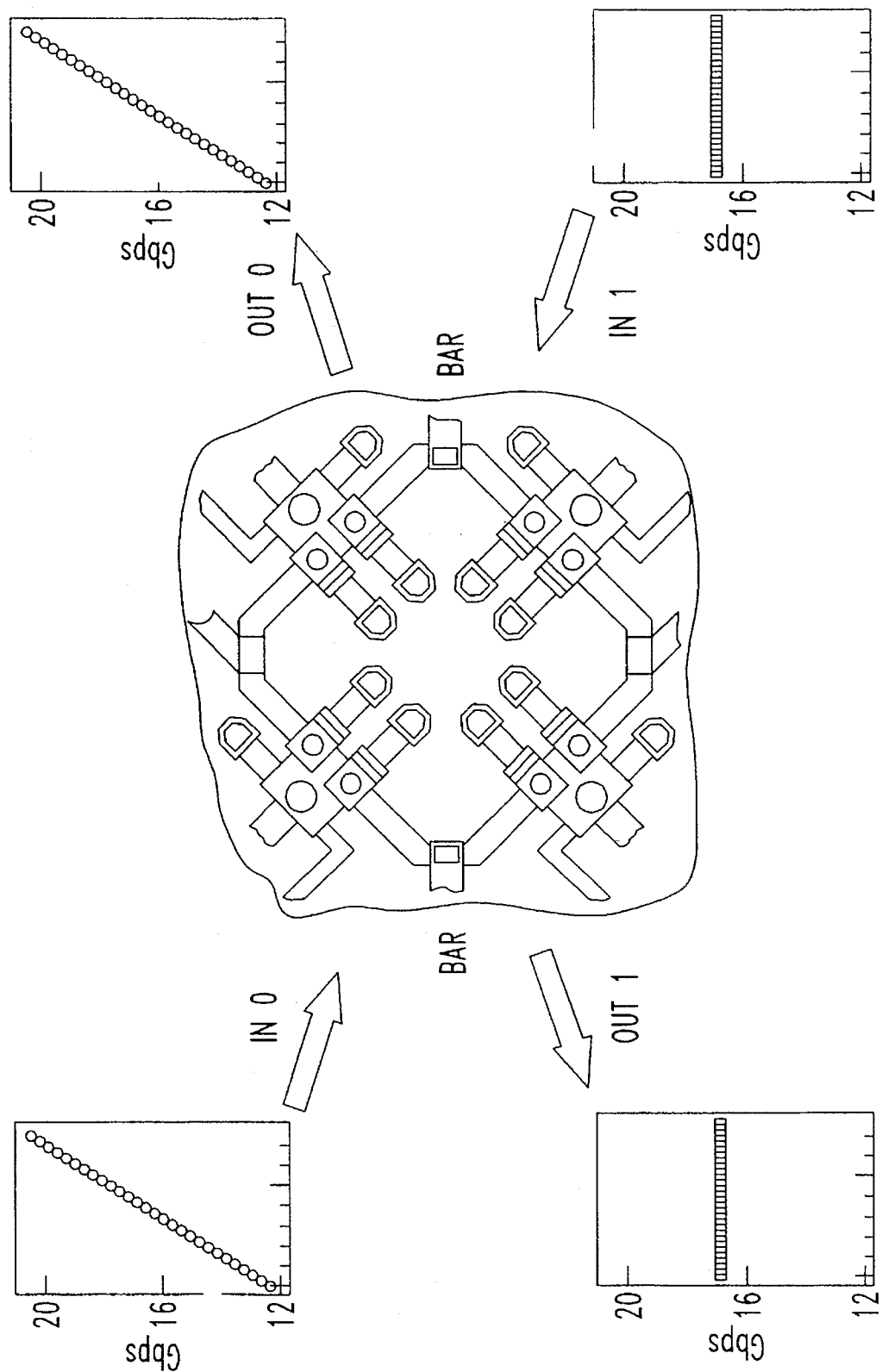
FIG. 5 is a schematic representation of a "bar" signal operation and the results of test data therefor.
Figure 6:
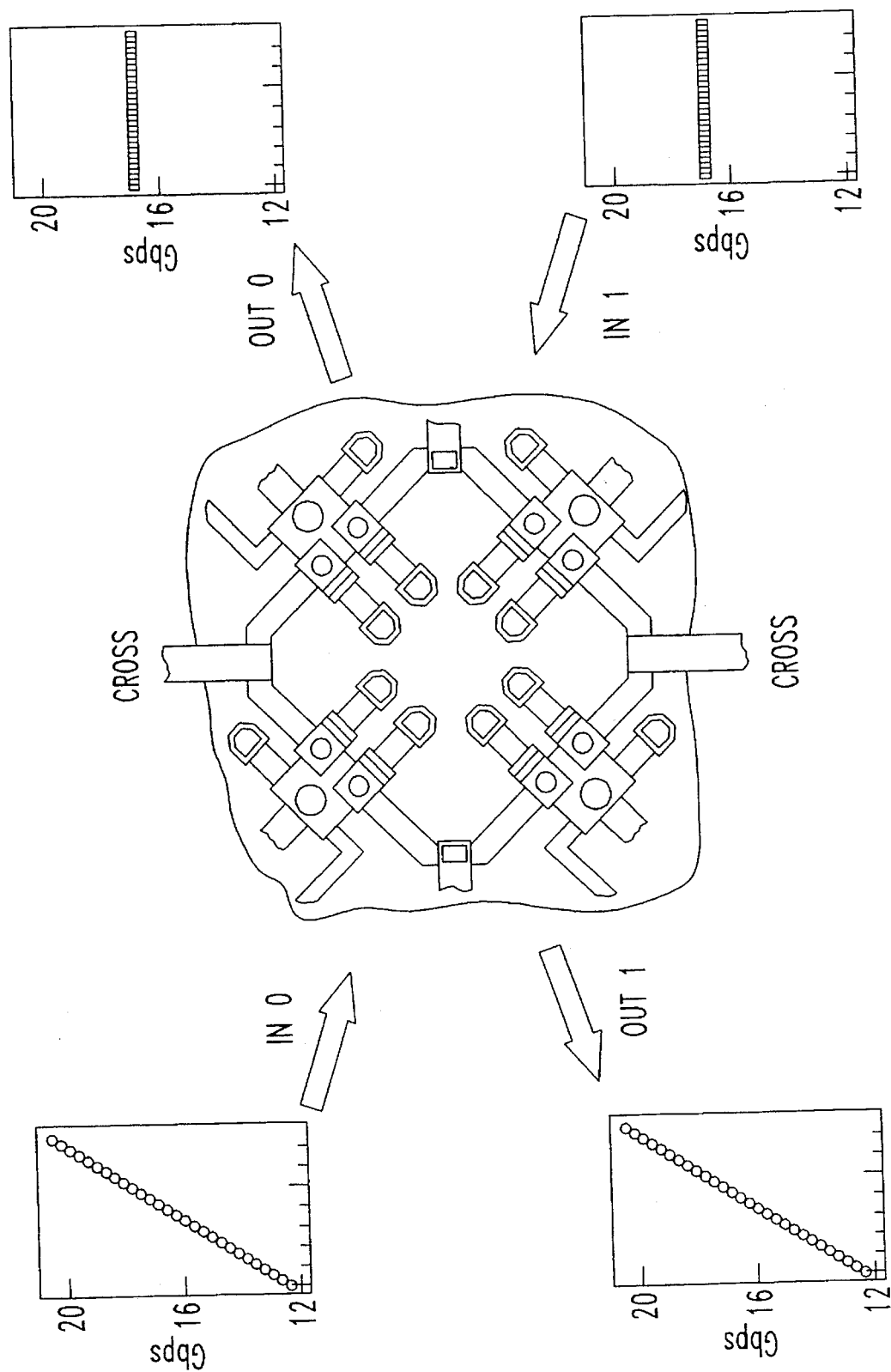
FIG. 6 is a schematic representation of a "cross" signal operation and the results of test data therefor.

An SFQ switch for operation at multi-gigahertz speeds has been constructed with non-hysteretic Josephson junctions. FIGS. 5 and 6 show the results of tests conducted on a switch operating at 16–17 GHz. FIG. 5 shows the successful operation of a "bar" action by the switch and FIG. 6 shows the successful "cross" action of the switch.

While certain presently preferred embodiments have been shown and described, it is distinctly understood that the invention is not limited thereto but may be otherwise embodied within the scope of the following claims.

We claim:

1. A switch for controlling the throughput of a signal between a pair of input channels and a pair of output channels comprising:

a. means for receiving an input signal from each of said pair of input channels;

b. means for transmitting an output signal to each of said pair of output channels;

c. four line channels provided within said switch, each of said four line channels connecting one of said pair of input channels and one of said pair of output channels; and d. four line channel switches, one line channel switch provided on each of said four line channels, each of said four line channel switches being operable by a control signal to open or close said each of said four line channels, wherein a Josephson junction is provided between each line channel switch and each of said input channels and said output channels, and wherein each of said line channel switches comprises a pair of non-hysteretic Josephson junctions and a pair of inductors wherein application of a bias current intermediate said pair of non-hysteretic Josephson junctions blocks passage of a single flux quantum pulse through said line channel.

2. The switch of claim 1 wherein said control signal applies said bias current to said line channel switch.

3. A switch for controlling the throughput of a signal between a plurality of input channels and a plurality of output channels comprising:

a. means for receiving an input signal from each of said plurality of input channels;

b. means for transmitting an output signal to each of said plurality of output channels;

c. a plurality of line channels provided within said switch, each of said plurality of line channels connecting one of said plurality of input channels and one of said plurality of output channels; and d. a plurality of line channel switches, one line channel switch provided on each of said plurality of line channels, each of said plurality of line channel switches being operable by a control signal to open or close said each of said plurality of line channels, wherein a Josephson junction is provided between each line channel switch and each of said input channels and said output channels, and wherein each of said line channel switches comprises a pair of non-hysteretic Josephson junctions and a pair of inductors wherein application of a bias current intermediate said pair of non-hysteretic Josephson junctions blocks passage of a single flux quantum pulse through said line channel.

4. The switch of claim 3 wherein said control signal applies said bias current to said line channel switch.

5. A digital switch comprising:

a pair of input terminals;

a pair of output terminals;

four line channels, each of said line channels being connected between one of said input terminals and one of said output terminals, wherein each of said line channels includes a pair of non-hysteretic Josephson junctions; and means for controlling each line channel's ability of passing a single flux quantum voltage pulse to said output terminals.

6. A digital switch as recited in claim 5, wherein each of said line channels further comprises:

a pair of inductors connected in series between said pair of non-hysteretic Josephson junctions.

7. A digital switch as recited in claim 6, wherein:

said means for controlling the channel's ability of pass a single flux quantum voltage pulse includes a control input for receiving bias current, said control input being connected to a point between said inductors.

8. A digital switch as recited in claim 5, further comprising:

a plurality of inductors, each of said inductors being connected between one of said input terminals or one of said output terminals, and two of said line channels.

* * * * *